United States Patent [19]

Lee

[11] Patent Number: 5,482,555
[45] Date of Patent: Jan. 9, 1996

[54] LIQUID-PHASE EPITAXY GROWTH SYSTEM AND METHOD FOR GROWING EPITAXIAL LAYER

[75] Inventor: Song J. Lee, Suweon, Rep. of Korea

[73] Assignee: Samsung Electronics Co., Ltd., Suweon, Rep. of Korea

[21] Appl. No.: 234,277

[22] Filed: Apr. 28, 1994

Related U.S. Application Data

[62] Division of Ser. No. 752,856, Aug. 30, 1991, Pat. No. 5,334,278.

[30] Foreign Application Priority Data

May 16, 1991 [KR] Rep. of Korea .......................... 91-7955

[51] Int. Cl.$^6$ .......................... H01L 21/208; C30B 19/06
[52] U.S. Cl. .............. 118/412; 118/415; 117/57
[58] Field of Search ...................... 118/412, 415, 118/401–402, 406; 117/57, 61; 437/92, 117, 119, 120, 122

[56] References Cited

U.S. PATENT DOCUMENTS

| 3,753,801 | 8/1973 | Lockwood et al. | 117/57 |
| 3,767,481 | 10/1973 | Ettenberg et al. | 117/57 |
| 4,357,897 | 11/1982 | Lewsin | 118/412 |
| 4,470,368 | 9/1984 | Reynolds, Jr. | 118/412 |

FOREIGN PATENT DOCUMENTS

| 52-52570 | 4/1977 | Japan . | |
| 59-18193 | 1/1984 | Japan | 117/57 |

Primary Examiner—Robert J. Warden
Assistant Examiner—Hien Tran
Attorney, Agent, or Firm—Ladas & Parry

[57] ABSTRACT

A liquid-phase epitaxy system having an LPE boat which consists of a slider section, a source holder section, and a contacting well section, in which the distance between the first two contacting wells is different from that between the first two source holding wells, so that the concentration of the solutions can be controlled by a proper temperature profile, since the solution for melt-etching and the remaining solution for the epitaxial growth are not deposited into the contact wells at the same time. This permits in-situ melt-etching and improvement in the quality of the epitaxial layer and the epitaxial yield by minimizing the contamination of the melt-etched surface of the substrate.

7 Claims, 2 Drawing Sheets

LIQUID-PHASE EPITAXY GROWTH SYSTEM AND METHOD FOR GROWING EPITAXIAL LAYER

This is a divisional of application(s) Ser. No. 07/752,856 filed on Aug. 30, 1991, now U.S. Pat. No. 5,334,278.

The present invention is related to an LPE (Liquid Phase Epitaxy) system and a method for growing high-quality epitaxial layers by means of in-situ melt-etch (or meltback) operation.

BACKGROUND AND PRIOR ART

The LPE which is commercially very important to grow opto-electronic devices such as laser diodes and LFDs involves the precipitation of a material from a supersaturated solution onto a substrate of similar crystalline structure to that of the precipitate.

The advantages of LPE which was first introduced by H. Nelson in 1963 are its simplicity, low cost, good reproducibility, and low dislocation density of grown epitaxial films.

FIG. 1 shows a cross-sectional view of a conventional LPE boat.

The LPE boat consists of a slider section 1, a contact well section 3, and a source holder section 5.

A substrate is loaded into a substrate slot 7 formed at a predetermined position of the slider section 1. Various sources are loaded into source holding wells 9a~9e formed at the source holder section 5.

Homogenized melts in the source holding wells 9a~9e are dropped into contacting wells 11a~11e formed in the contacting well section 3.

The loaded substrate 15 makes contact with contacting melts 13a~13e sequentially. In general, in the conventional LPE boat, the distance between neighboring source holding wells is the same as that of its corresponding neighboring contacting wells.

The growth procedure of the epitaxial layers using the conventional LPE is described below.

First, source materials 13a~13e are loaded into the source holding wells 9a~9e.

After dissolving the sources 13a~13e by heating, the source holding wells 9a~9e are aligned with the contacting wells 11a~11e by pulling the source holder section 5. Then, the contacting wells 11a~11e are simultaneously filled with the dissolved sources, that is, solutions 13a~13e in the source holding wells 9a~9e.

Next, the remaining melts in the source holding wells 9a~9e are separated from those in the contacting wells 11a~11e by pushing the source holding section 5 back to its original position.

After lowering the boat temperature, holder or substrate slot 7 is placed under the first contacting well 11a by displacing the slider section 1.

One of the conventional approaches in the use of melt-etching is to prepare an undersaturated solution usually in the first contacting well 11a by accurately controlling the amount of the saturation source 13a, for instance, polycrystalline GaAs loaded in the first source holding well 9a. However, it is very difficult to adjust the amount of clean polycrystalline saturation source, since the amount of the saturation source is subject to change during either cleaning or etching. Furthermore, the cleaned saturation source is easily contaminated during measuring the weight of the sources.

Another approach to prepare the undersaturated solution is to raise the melt temperature until the desired undersaturation of the solution is reached. In this case, after the melt-etch is performed, the substrate should wait until the desired supersaturation of the growth solutions is achieved by lowering the melt temperature. However, during the waiting period, the fresh melt-etched surface may be recontaminated due to the exposure to the growth environment.

SUMMARY OF THE INVENTION

An object of the present invention is to provide an LPE boat which doesn't need to control the amount of the saturation source accurately in order to prepare an undersaturated solution for in-situ melt-etching.

Another object of the present invention is to provide an LPE growth method in which the melt-etch and growth can be performed sequentially without any interruption, and thus, the in-situ contamination is prevented resulting in hill quality epitaxial films.

Still another object of the present invention is to provide an LPE growth method, in which both the undersaturation of the melt-etch solution and the supersaturation of the growth solution can be controlled very accurately, and therefore, the overall process will be reliable and reproducible.

According to one aspect of the present invention, there is provided an LPE boat comprising:

a slider section with a substrate slot into which substrate is loaded, a source holder section with source holding wells, and a contacting well section having a plurality of contacting wells, of which one is filled with undersaturated solution for melt-etching and the others are filled with growth solutions, the contacting wells being disposed in such a manner that the distance between the first two contacting wells is different from that between the first two source holding wells.

According to another aspect of the present invention, there is provided an LPE growth method comprising the steps of:

dissolving sources for both melt-etch wells and growth wells at a temperature $T_1$;

filling a first contacting well with a solution for melt-etching by pushing the source holding section;

filling the remaining contacting wells by pulling the source holder section after homogenizing the melts at the temperature $T_1$, then raising the temperature to $T_2$;

pulling the source holder section to the end position after homogenizing the melts in order to separate the melts in the contacting wells from the melts in the source holding wells;

lowering the melt temperature to $T_3$;

placing the substrate under the first contacting well by pulling the slider section and performing melt-etch of appropriate thickness; and growing epitaxial layers by contacting the substrate with the next melts sequentially.

BRIEF DESCRIPTION OF THE DRAWINGS

These above and other objects, features, and advantages of the present invention will become more clear from the following description of preferred embodiments taken in conjunction with the accompanying drawings, in which.

DETAILED DESCRIPTION OF THE INVENTION

The present invention will now be described in more detail with reference to the accompanying drawings.

Figure 1:
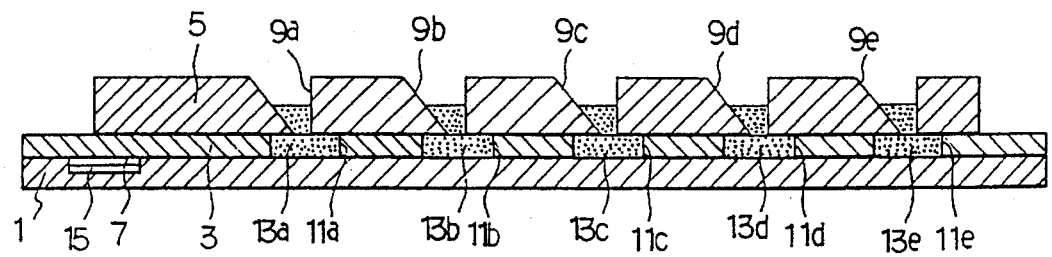
FIG. 1 is a cross-sectional view of a conventional LPE boat.
Figure 2:
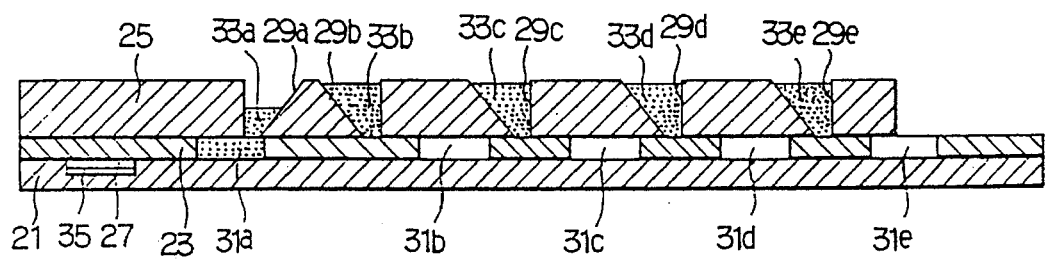
FIG. 2 is a cross-sectional view of an LPE boat according to the present invention.

FIG. 2 shows a cross-sectional view of an LPE boat according to the present invention. In FIG. 2, the LPE boat comprises a slider section 21, a contact well section 23, and a source holder section 25. A substrate slot 27, in which a substrate 35 is loaded, is formed at a predetermined position of the slider section 21. Also, source holding wells 29a–29e are formed in the source bolder section 25 to be filled with sources 33a–33e. Contact wells 31a–31e are formed in the contact well section 23.

The distance between the first two source holding wells 29a–29b is smaller than that between the first two contacting wells, 31a–31b so that only the first contacting well 31a can be filled with a melt as shown in FIG. 4 (B) . The other contacting wells 31b–31e are filled with melts at different stages as shown in FIG. 4 (C).

Thus, the equilibria concentration of the solution filled in the first contacting well 31a can be controlled independently of the equilibrium concentration of the solutions filled in the other contacting wells 31b–31c.

Figure 3:
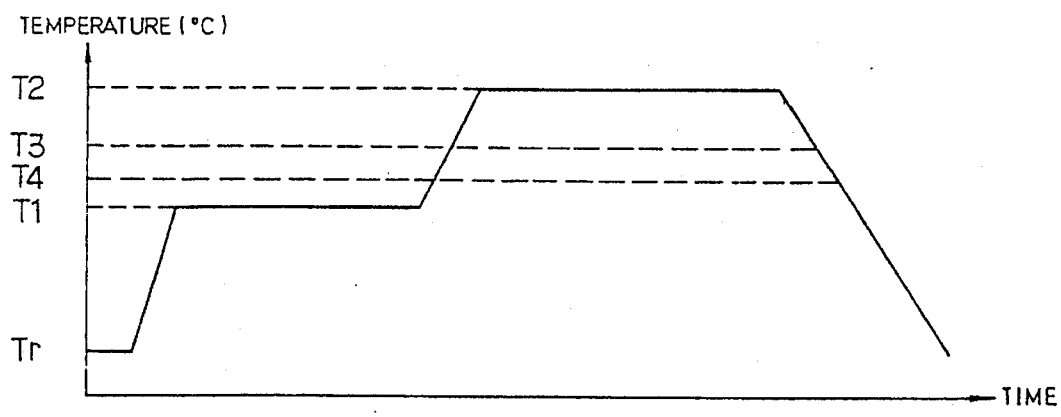
FIG. 3 is a graph showing temperature profile during the growth of epitaxial layers by using the boat according to the the present invention.

FIG. 3 shows a temperature profile for growing epitaxial layers according to the present invention.

In FIG. 3, Tr represents room temperature, $T_1$ represents a temperature for homogenizing the solution filled in the first contacting well 31a, $T_2$ represents a temperature for homogenizing the solutions filled in the other contacting wells 31b–31e, $T_3$ represents a temperature for performing the melt-etching of the substrate 35 by the undersaturated solution in the first contacting well 31b, and $T_4$ represents a temperature for beginning the growth or the epitaxial layers.

FIGS. 4(A)–4(D) show cross-sectional views of the LPE boat to explain the growth procedure.

Figure 4A:
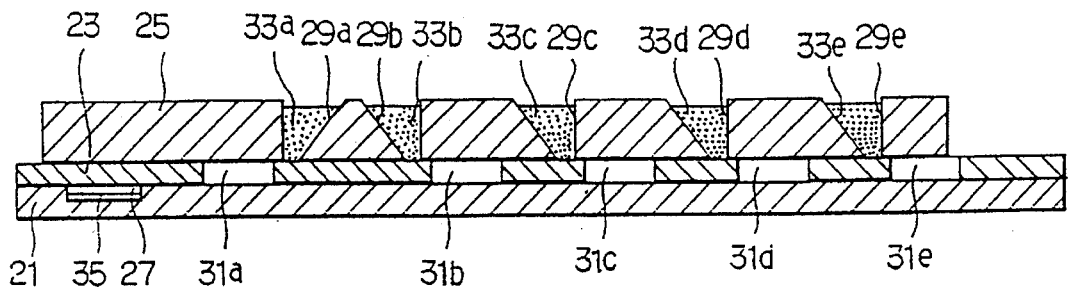
FIGS. 4(A)–4(D) are crosssectional views of the LPE boat to explain the growth procedure according to the present invention.
Figure 4B:
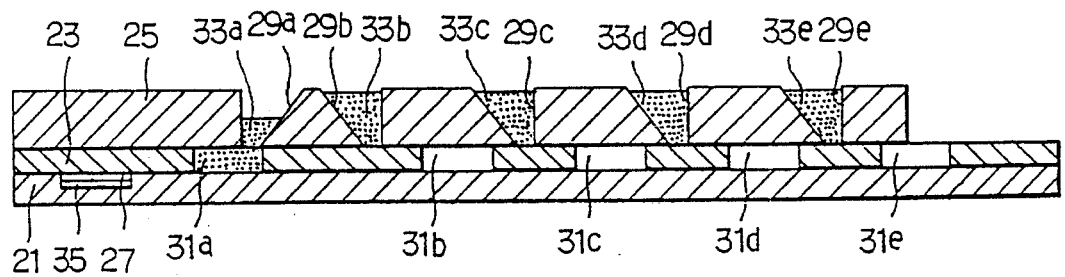

Referring to FIG. 4(A), the solutions 33a–33e in the source holding wells 29a–29b are in equilibrium condition at the temperature $T_1$.

Referring to FIG. 4 (B), the solution 33a in the first source holding well 29a is filled into the first contacting well 31a by pushing the source holder section 25, whereas the remaining solutions 33b–33e are not filled into the contact wells 31b–31e yet. Then, the solution 33a in the first contact well 31a is sufficiently homogenized at the temperature $T_1$.

Referring to FIG. 4 (C), the solutions 33b–33e are filled into the remaining contacting wells 31b–31e by pulling the source holder section 25, while the first source holding well 29a becomes separated from the first contacting well 31a. Then, the solutions 33b–33c in the contacting wells 31b–31e are sufficiently homogenized at the raised temperature $T_2$, while the first solution in the first contacting well 31a is undersaturated.

Figure 4C:
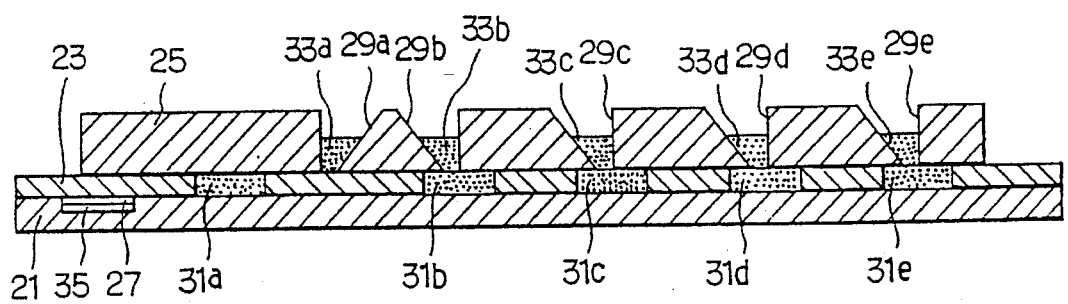
Figure 4D:
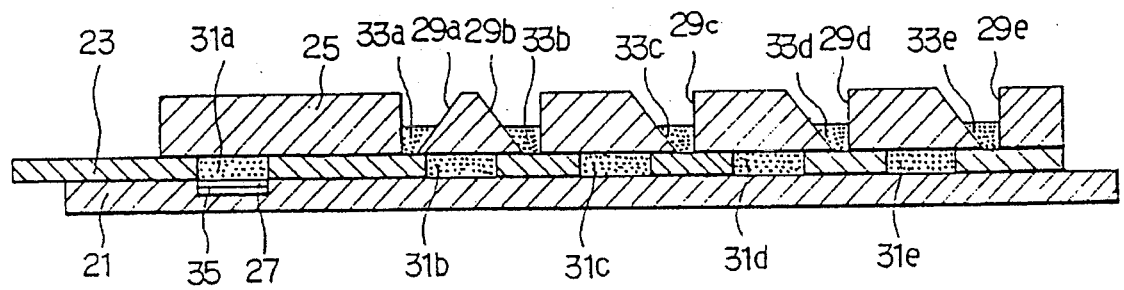

Referring to FIG. 4(D), the source holding wells 29a–29e are separated from the contacting wells 31a–31e by pulling the source holder section 25 as shown in FIG. 4(C). Subsequently, the temperature is lowered to $T_3$ so that the solution in the first contacting well 31a is maintained in a proper undersaturation state.

By pulling the slider section 21, the substrate 35 is placed under the first contacting well 31. Then, the undersaturated solution in the first contacting well 31a performs the in-situ melt-etch of the substrate 35. At this time, the solutions in the remaining contacting wells 31b–31e are in the supersaturation state.

Subsequently, the degree of the supersaturation of the solutions in the contacting wells 31b–31e increases as the temperature is lowered to the temperature $T_4$ during melt-etch. After the melt-etch is finished, the substrate 35 is made to contact the remaining solutions sequentially.

In the LPE boat as mentioned above, the equilibrium concentration of the solution for melt-etch can be controlled independently of the equilibrium concentration of the solutions for epitaxial growth of layers by achieving a proper temperature profile, and thus the undersaturation of the solution for melt-etch can be very accurately controlled.

Furthermore, the epitaxial growth can be performed immediately after the melt-etch without any interruption and, therefore, in-situ contamination of the melt-etched surface is minimized. As a result, the quality of the epitaxial layers will be improved drastically.

The invention is in no way limited to the embodiment described hereinabove. Various modifications of the disclosed embodiment as well as other embodiments of the invention will become apparent to a person skilled in the art upon reference to the description of the invention. It is, therefore, contemplated that the appended claims will cover any such modifications or embodiments as fall within the true scope of the invention.

What is claimed is:

1. A liquid-phase epitaxy growth system comprising an LPE boat consisting of:

a slider section having a substrate slot into which a substrate is loaded;

a source holder section above said slider section and having a plurality of adjacent source holding wells to be filled with various sources for melt-etching substrate and for growth of epitaxial layers on the substrate; and a contacting well section disposed between said slider section and said source holder section having a plurality of adjacent contacting wells to be filled with solutions of the various sources in which said adjacent contacting wells are separated by predetermined distances, one of the said predetermined distances between adjacent contacting wells being different from the predetermined distance between the remaining contacting adjacent contact wells.

2. A liquid-phase epitaxy growth system comprising an LPE boat consisting of:

a slider section having a substrate slot into which a substrate is loaded;

a source holder section above said slider section and having a plurality of adjacent source holding wells to be filled with various sources for melt-etching substrate and for growth of epitaxial layers on the substrate in which said adjacent source holding wells are separated at predetermined distances, one of said predetermined distances being different from other predetermined distances between other adjacent source holding wells; and a contact well section disposed between said slider section and said source holder section having a plurality of contacting wells to be filled with said various sources.

3. A liquid-phase epitaxy growth system comprising an LPE boat consisting of:

a slider section having a substrate slot in which a substrate is loaded;

a source holder section above said slider section and having a plurality of adjacent source holding wells to be filled with various sources for melt-etching the substrate and for growth of epitaxial layers on the substrate; and a contacting well section disposed between said slider section and said source holder section having a plurality of adjacent contacting wells to be filled with various sources, the wells in the source holder section and the wells in the contacting well section being spaced so that the various sources in the wells in the source holder section are deposited into respective wells in the contacting well section, the spacing between the adjacent wells in said source holder section and said contacting well section being irregular so that one of said contacting wells is supplied with the source from one of said source holding wells and upon relative displacement of said source holder section and said contacting well section the other contact wells are thereafter supplied with the sources from the other source holding wells.

4. A liquid-phase epitaxy growth system comprising an LPE boat including:

a slider section having a substrate slot in which a substrate is loaded;

a contacting well section above said slider section, said contacting well section having a plurality of adjacent contacting wells disposed in spaced relation along said contacting well section;

a source holder section above said contacting well section, said source holder section having a plurality of adjacent source holding wells to be filled with various sources for melt-etching the substrate and for growth of epitaxial layers on the substrate, said source holding wells being disposed in spaced relation along said source holder section; and said source holder section and said contacting well section being relatively displaceable so that said source holding wells and said contacting wells come into communication so that the sources in the source holding wells are deposited into respective contacting wells, the spaced relation of the source holding wells and of the contacting wells being irregular such that one contacting well communicates with a respective source other holding well while other contacting wells are out of communication with the respective other holding wells.

5. A liquid-phase epitaxy growth system as claimed in claim 4, wherein said other contacting wells are equally spaced and said respective other holding wells are also equally spaced at the same spacing as said other contacting wells.

6. A liquid-phase epitaxy growth system as claimed in claim 5, wherein the spacing between said one contacting well and the next adjacent other contacting well is different from the spacing between said respective source holding well and the next adjacent other source holding well.

7. A liquid-phase epitaxy growth system as claimed in claim 6, wherein said one contacting well receives from the respective source holding well a source for melt-etching the substrate while said other of said contacting wells simultaneously receive from the respective other source holding wells sources for growth of epitaxial layers on said substrate.

\* \* \* \* \*